United States Patent [19]
Phillips et al.

[11] Patent Number: 5,792,550
[45] Date of Patent: Aug. 11, 1998

[54] BARRIER FILM HAVING HIGH COLORLESS TRANSPARENCY AND METHOD

[75] Inventors: Roger W. Phillips; Lauren R. Wendt, both of Santa Rosa; Myra Tan-Johnson, Petaluma; David W. Todd, Sebastopol, all of Calif.

[73] Assignee: Flex Products, Inc., Santa Rosa, Calif.

[21] Appl. No.: 430,250

[22] Filed: Apr. 28, 1995

Related U.S. Application Data

[63] Continuation of Ser. No. 78,771, Jun. 17, 1993, abandoned, which is a continuation of Ser. No. 785,870, Nov. 1, 1991, abandoned, which is a continuation of Ser. No. 535,183, Jun. 8, 1990, abandoned, which is a continuation-in-part of Ser. No. 426,342, Oct. 24, 1989, abandoned.

[51] Int. Cl.$^6$ ............................................. B32B 9/04
[52] U.S. Cl. .................... 428/336; 428/213; 428/220; 428/339; 428/446; 428/448; 428/480; 428/483
[58] Field of Search ....................... 428/34.4, 34.6, 428/34.8, 35.2, 35.4, 35.7, 213, 220, 336, 339, 347, 480, 483, 446, 701, 702, 448

[56] References Cited

U.S. PATENT DOCUMENTS

| | | | |
|---|---|---|---|
| 3,442,686 | 5/1969 | Jones | 428/336 |
| 3,833,406 | 9/1974 | White | 428/34.6 |
| 4,536,998 | 8/1985 | Matteuci et al. | 428/216 |
| 4,542,061 | 9/1985 | Fukushima et al. | 428/220 |
| 4,552,791 | 11/1985 | Hahn | 428/35.7 |
| 4,581,282 | 4/1986 | Higgins | 428/216 |
| 4,590,118 | 5/1986 | Yatabe | 428/215 |
| 4,702,963 | 10/1987 | Phillips et al. | 428/480 |
| 4,847,145 | 7/1989 | Matsui | 428/480 |
| 4,878,765 | 11/1989 | Watkins et al. | 428/35.4 |
| 5,008,148 | 4/1991 | Thurm et al. | 428/336 |

FOREIGN PATENT DOCUMENTS

| | | | |
|---|---|---|---|
| 8128852 | 8/1983 | Japan | 428/702 |
| 402261639 | 10/1990 | Japan | . |
| 0015526 | 1/1991 | Japan | . |
| 1086482 | 10/1967 | United Kingdom | . |
| 2210826 | 6/1989 | United Kingdom | 428/702 |

*Primary Examiner*—Timothy M. Speer
*Attorney, Agent, or Firm*—Flehr Hohbach Test Albritton & Herbert LLP

[57] ABSTRACT

Barrier film with a high colorless transparency comprising a flexible plastic substrate. A barrier layer is formed on the surface and has a thickness ranging from approximately 50 to 100 Angstroms and is formed of a material selected from the group of aluminum oxide, tin oxide and yttrium oxide. An additional barrier layer formed of silicon dioxide may also be formed on the barrier layer.

24 Claims, 4 Drawing Sheets

BARRIER FILM HAVING HIGH COLORLESS TRANSPARENCY AND METHOD

This is a continuation of application Ser. No. 08/078,771, filed Jun. 17, 1993, now abandoned which is a continuation of application Ser. No. 07/785,870 filed Nov. 1, 1991 now abandoned, which is a continuation of application Ser. No. 07/535,183 filed Jun. 8, 1990 now abandoned, which is a continuation-in-part of application Ser. No. 07/426,342 filed Oct. 24, 1989, now abandoned.

This invention relates to a barrier film having high colorless transparency and a method for forming the same.

Barrier films have heretofore been provided. Typical coatings are of the type disclosed in British patent specification 1,086,482. It is disclosed therein that the preferred inorganic coatings are oxides of silicon and aluminum which can be deposited as transparent flexible coatings in a glassy state. Silicon monoxide or silicon dioxide are mentioned as starting materials and aluminum oxide for the aluminum coatings. This aluminum oxide is identified in Table V as being Norton Alundum #4186. This is not a pure aluminum oxide but a mixture of aluminum oxide and silicon dioxide ($Al_2O_3$ in a $SiO_2$ binder). Zirconium oxide is also mentioned as a starting material. However, this material is not particularly suited for evaporation techniques because of its high melting temperature. Silver chloride which is also identified as a starting material is undesirable because it becomes hazy when deposited as a coating material. With respect to all of the starting materials mentioned, they are deposited as a single layer. In coating operations, the roll speed is very slow at the rate of 3 inches per minute. The single layer is also deposited to a thickness, as for example, 6000 Angstroms which is very thick. It is pointed out that the minimum thickness is 0.02 microns (200 Å). Below this thickness the inorganic barrier layer is ineffectual. The tables in the British patent specification 1,086,482 disclose the barrier properties with respect to oxygen and helium, but do not address water permeability. In addition, in U.S. Pat. No. 4,702,963 there is disclosed a barrier film which is made from silicon monoxide or a suboxide of $SiO_2$. Although this barrier film has good barrier properties, it has the undesirable feature that it has an amber color. This amber color is objectionable in many packaging applications because it obscures the true color of the product within the package. It has been found that when silicon dioxide is deposited directly on a film by electron beam evaporation no additional barrier properties are provided by the silicon dioxide. There is therefore a need for a new and improved barrier film which has a colorless transparency. In addition, there is a need to replace existing aluminized polyester and co-extruded polymeric films. Also, in view of solid waste disposal problems, there is a need to limit the use of non-recyclable plastic films. There is also a need to reduce the total volume of plastic waste which is non-recyclable by reducing the thickness and the number of plastic layers and by recycling the plastic film. Co-extruded plastic film structures are not easily recycled because of the complexity of the chemical structures in the co-extrudants. There is also a need to reduce the use of PVC and PVDC as barrier materials in film in order to eliminate migration of un-reacted monomers reaching food contents packaged within such barrier films.

In general, it is an object of the present invention to provide a barrier film having high colorless transparency and a method for making the same.

Another object of the invention is to provide a barrier film of the above character which will tear in a straight line.

2

Another object of the invention is to provide a barrier film of the above character which does not require the use of aluminum.

Another object of the invention is to provide a barrier film of the above character which does not require the use of co-extruded polymeric films.

Another object of the invention is to provide a barrier film of the above character which reduces the total volume of plastic required.

Another object of the invention is to provide a barrier film of the above character which reduces the difficulty of recycling.

Another object of the invention is to provide a barrier film of the above character which can be utilized for food packaging which can be used in microwave ovens.

Another object of the invention is to provide a barrier film of the above character which uses a non-metal which can be utilized for packaging food which can be used in a microwave unit and still be transparent with a long shelf life.

Another object of the invention is to provide a barrier film of the above character in which PVDC need not be utilized as barrier materials.

Another object of the invention is to provide a barrier film of the above character which can maintain a given moisture content for contents packaged in the barrier film.

Another object of the invention is to provide a barrier film and method in which the barrier film can be produced in a roll coater at high production speeds.

Another object of the invention is to provide a barrier film of the above character which is provided with a heat seal layer so that it can be readily utilized as a self-sealing packaging material.

Additional objects and features of the invention will appear from the following description in which the preferred embodiments are set forth in detail in conjunction with the accompanying drawings.

In general, the barrier film having a high colorless transparency is comprised of a substrate formed essentially of a plastic having first and second surfaces. A barrier layer is formed on the first surface and has a thickness ranging from approximately 50 to 180 Angstroms and is formed from a material selected from the group of aluminum oxide ($Al_2O_3$), tin oxide ($SnO_2$) and yttrium oxide ($Y_2O_3$). An additional layer of silicon dioxide may be formed on the barrier layer and having a thickness ranging from 100 to 1000 Angstroms.

Figure 1:
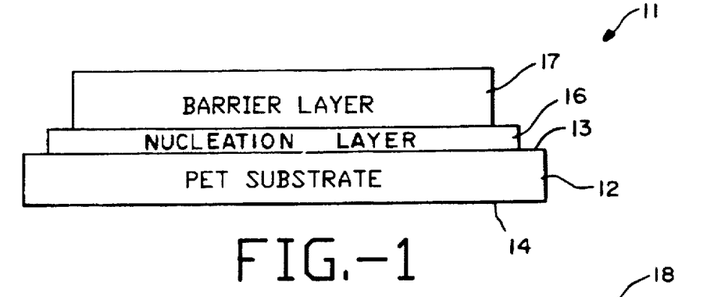
FIG. 1 is a cross sectional view of a barrier film incorporating the present invention in which a barrier layer is provided on one side of the flexible plastic substrate.

More in particular, as shown in FIG. 1, the barrier film 11 is comprised of a substrate 12 formed of a suitable flexible plastic as, for example, PET which is a polyester having a thickness ranging from approximately 48 gauge which is approximately ½ mil to a thickness of 4 mils. The substrate is provided with first and second surfaces 13 and 14. A nucleation layer 16 of a thickness ranging from approximately 50 to 100 Angstroms is deposited on the surface 13. The nucleation layer is formed of a single material selected from pure aluminum oxide ($Al_2O_3$), pure tin oxide ($SnO_2$), pure yttrium oxide ($Y_2O_3$), with pure meaning 99.0% purity or better.

Typically the nucleation layer is formed by electron beam evaporation of material onto the surface 13. If desired, the material also can be deposited by sputtering. Electron beam evaporation has been found to be desirable because it is possible to evaporate material rapidly and over a wide area so that the material can be applied cost effectively on rapidly moving sheet material in a roll coater. By way of example, the material forming the nucleation layer can be evaporated over a width of at least two meters and with a rapidly moving film.

A barrier layer 17 formed of silicon dioxide ($SiO_2$) is then deposited upon the nucleation layer 16. The starting material is silicon dioxide which is a clear transparent material. It is deposited by electron beam evaporation to a thickness ranging from 100 to 1000 Angstroms. Alternatively, if desired, the silicon dioxide can then be deposited by reactive sputtering. As hereinafter pointed out that MS-65 produced by Flex Products, Inc. of Santa Rosa, Calif. can be substituted for the silicon dioxide.

The coating applied to the surface 13 which is comprised of the nucleation layer 16 and the barrier layer 17 is deposited in a two-step process in which the nucleation layer 16 is deposited first followed by the silicon dioxide barrier layer 17. This can be readily accomplished on a roll coater by first depositing the nucleation layer 16 followed by the silicon dioxide layer 17 at subsequent spaced apart locations in the roll coater. Alternatively, the two layers, the nucleation layer and the barrier layer 17 can be deposited in two separate passes of the film in the roll coater.

Figure 2:
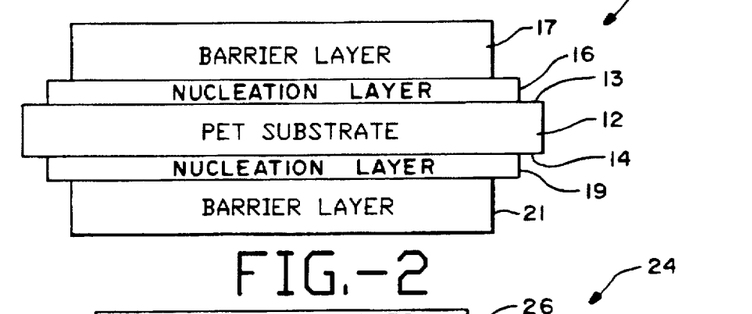
FIG. 2 is a cross sectional view of a barrier film incorporating the present invention in which a barrier layer is provided on both sides of the flexible plastic substrate.

If still further improved barrier properties are desired for the film, the same type of coating which is placed on the one side or surface 13 of the flexible plastic substrate 12 can also be placed on the other side or surface 14 of the substrate 12. Thus, there has been provided in FIG. 2, a barrier film 18 which has the nucleation layer 16 and the barrier layer 17 on the surface 13 and an additional nucleation layer 19 on the surface 14 followed by a silicon dioxide barrier layer 21. The two layers 19 and 21 can be formed of the same materials and can have the same characteristics as the layers 16 and 17 on the surface 13 of the substrate 12.

Figure 3:
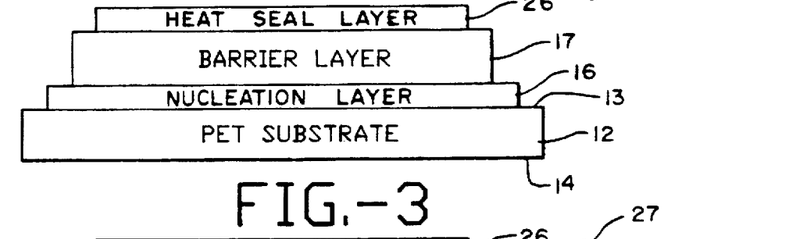
FIG. 3 is a cross sectional view similar to the one shown in FIG. 1 with a heat seal layer to facilitate use of the barrier film as a packaging material.

When the barrier film of the present invention is to be utilized as a packaging material, a barrier film 24 of the type shown in FIG. 3 can be utilized. The embodiment of the barrier film 11 shown in FIG. 1 is provided with a heat seal layer 26 formed of a suitable heat sealing material well known to those skilled in the art. A suitable heat sealing material would be cross-linked ethylene acrylic acid or high molecular weight ethylene acetate polymers or urethane polymers. Typically this could be accomplished by taking the roll coated polyester which has been coated with the nucleation layer 16 and the barrier layer and depositing the heat seal layer using a gravure coater or slot coater or other appropriate coater. The heat sealing material typically would be of a material in which heat sealing could be accomplished at 100° to 150° C. with a few seconds of contact.

Figure 4:
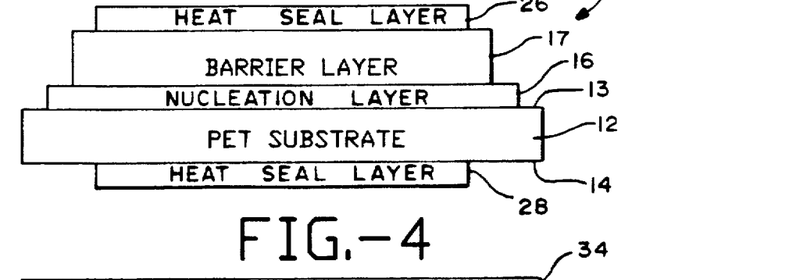
FIG. 4 is a cross sectional view similar to FIG. 2 but showing the use of heat seal layers on both sides of the substrate to facilitate use of the barrier film in packaging materials.

When heat seal capabilities are desired on both sides of a barrier film, a barrier film 27 such as that shown in FIG. 4 can be utilized in which another heat seal layer 28 is provided on the surface 14. This heat seal layer 28 can be formed of the same material as the heat seal layer 26. The heat seal layers can have a typical thickness ranging from 0.1–1 mil.

Table 1 as set forth below which sets forth water vapor barrier film data for barrier films, on polyester terephthalate (PET) which has been collected in making barrier films in accordance with the present invention.

TABLE 1

WATER VAPOR BARRIER FILM DATA

| Design Thickness | Substrate | WVTR g/100 sq.in./day |
|---|---|---|
| BOX COATER | | |
| UNCOATED | 1 mil PET | 1.2–1.3 |
| UNCOATED | 2 mil PET | .56–.63 |
| 2000Å $SiO_2$ | 2 mil PET | 0.51 |
| 1000Å $SiO_2$ | 2 mil PET | 0.67 |
| 500Å $SiO_2$ | 2 mil PET | 0.67 |
| 100Å $Al_2O_3$/500Å $SiO_2$ | 1 mil PET | 0.072 |
| 50Å $Al_2O_3$/500Å $SiO_2$ | 1 mil PET | 0.063 |
| 25Å $Al_2O_3$/500Å $SiO_2$ | 1 mil PET | 0.419 |
| 10Å $Al_2O_3$/500Å $SiO_2$ | 1 mil PET | 1.39 |
| 100Å $Al_2O_3$/500Å $SiO_2$ | 2 mil PET | 0.072 |
| 50Å $Al_2O_3$/500Å $SiO_2$ | 2 mil PET | 0.064 |
| 25Å $Al_2O_3$/500Å $SiO_2$ | 2 mil PET | 0.159 |
| 10Å $Al_2O_3$/500Å $SiO_2$ | 2 mil PET | 0.68 |
| 100Å $Al_2O_3$/250Å $SiO_2$ | 1 mil PET | 0.111 |
| 50Å $Al_2O_3$/250Å $SiO_2$ | 1 mil PET | 0.122 |
| 25Å $Al_2O_3$/250Å $SiO_2$ | 1 mil PET | 0.14 |
| 10Å $Al_2O_3$/250Å $SiO_2$ | 1 mil PET | 1.45 |
| 100Å $Al_2O_3$/250Å $SiO_2$ | 2 mil PET | 0.104 |
| 50Å $Al_2O_3$/250Å $SiO_2$ | 2 mil PET | 0.092 |
| 25Å $Al_2O_3$/250Å $SiO_2$ | 2 mil PET | 0.629 |
| 10Å $Al_2O_3$/250Å $SiO_2$ | 2 mil PET | 0.69 |
| 100Å $SnO_2$/500Å $SiO_2$ | 1 mil PET | 0.058 |
| 50Å $SnO_2$/500Å $SiO_2$ | 1 mil PET | 0.073 |
| 25Å $SnO_2$/500Å $SiO_2$ | 1 mil PET | 0.589 |
| 100Å $SnO_2$/500Å $SiO_2$ | 2 mil PET | 0.073 |
| 50Å $SnO_2$/500Å $SiO_2$ | 2 mil PET | 0.079 |
| 25Å $SnO_2$/500Å $SiO_2$ | 2 mil PET | 0.364 |
| 100Å $Y_2O_3$/500Å $SiO_2$ | 2 mil PET | 0.0468 |
| 50Å $Y_2O_3$/500Å $SiO_2$ | 2 mil PET | 0.0747 |
| 25Å $Y_2O_3$/500Å $SiO_2$ | 2 mil PET | 0.26 |
| 100Å $Y_2O_3$/500Å $SiO_2$ | 1 mil PET | 0.035 |
| 50Å $Y_2O_3$/500Å $SiO_2$ | 1 mil PET | 0.0917 |
| 25Å $Y_2O_3$/500Å $SiO_2$ | 1 mil PET | 0.542 |

TABLE 1-continued

WATER VAPOR BARRIER FILM DATA

| Design Thickness | Substrate | WVTR g/100 sq.in./day |
| --- | --- | --- |
| ROLL COATER | | |
| 75Å Al₂O₃/250Å SiO₂ | 1 mil PET | 0.14 |
| 75Å Al₂O₃/375Å SiO₂ | 1 mil PET | 0.13 |
| 75Å Al₂O₃/500Å SiO₂ | 1 mil PET | 0.14 |

It can be seen that the data in the above-identified table is gathered from two sources; a box coater and a roll coater. The water vapor transmission rate is set forth in grams per 100 square inches per day of barrier film. The flexible plastic substrate utilized had a thickness of 1 and 2 mils as shown. The table shows when the substrate was uncoated it had a water transmission rate appears to be directly related to the thickness of the film. Coating of the substrate with silicon dioxide alone at various thicknesses did very little, if any, to increase the barrier properties of the film. However, the addition of a nucleation layer formed of one of the materials previously identified gave dramatic improvements in the reduction in water vapor transmission rate as shown in the above table by a factor of approximately 20. It also shows that the water vapor transmission rate was not changed significantly by increasing the thickness of the substrate.

Figures 6, 7, 8:
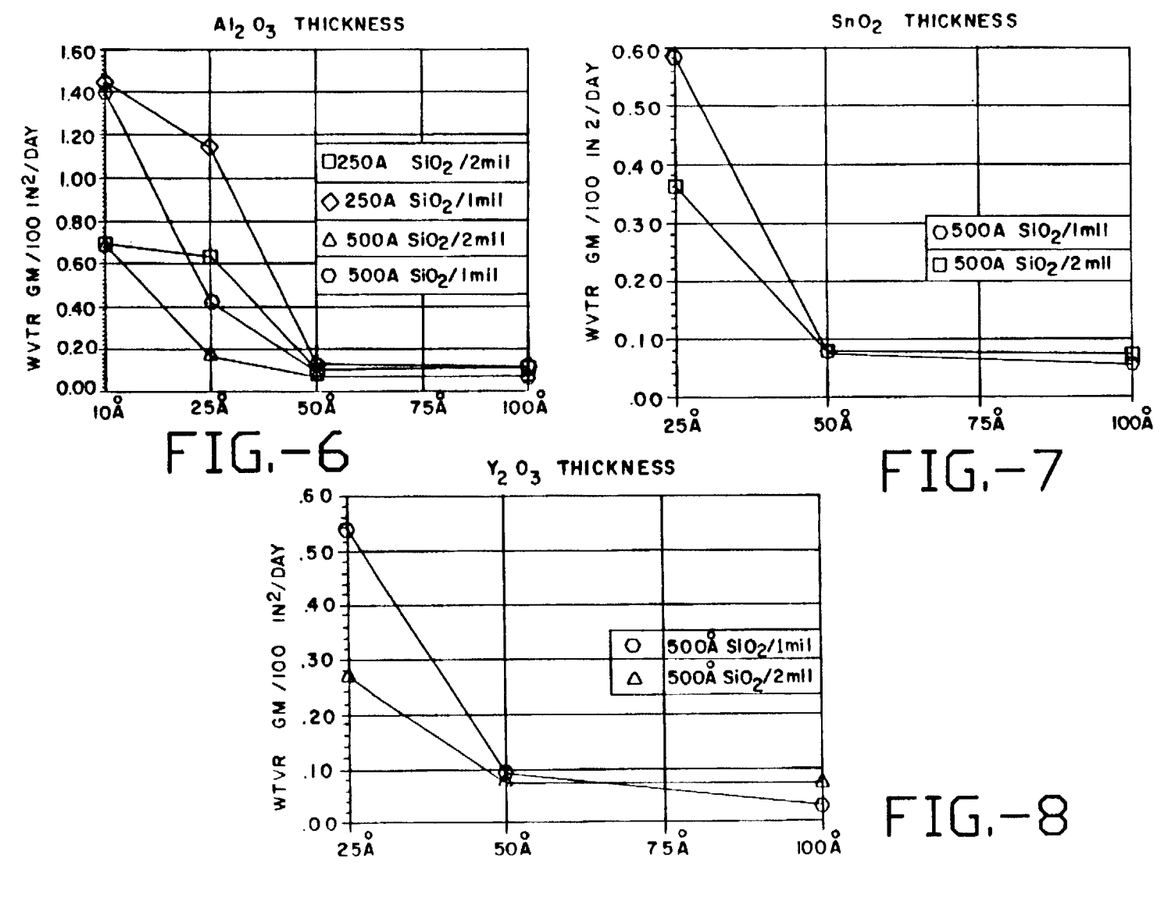
FIG. 6 is a graph showing water vapor transmission data using aluminum oxide and silicon dioxide layers.
FIG. 7 is a graph showing water vapor transmission data for tin oxide and silicon dioxide layers.
FIG. 8 is a graph showing water vapor transmission data using yttrium oxide and silicon dioxide layers.

Certain other data shown in Table 1 has been plotted in the graphs shown in FIGS. 6, 7 and 8. The data for the aluminum oxide nucleation layer is plotted in FIG. 6, whereas the data for the tin oxide nucleation layer is plotted in FIG. 7. Four plots are shown in FIG. 6. From FIG. 6, it can be seen that three variables are being plotted, the water vapor transmission rate, the Angstroms of aluminum oxide and the thickness of the silicon dioxide barrier layer. The graph shows that the thicker layers of silicon dioxide are more effective as a barrier to water vapor transmission than the thinner layer.

In examining the chart in FIG. 6, it also can be seen that when the nucleation layer of aluminum oxide becomes less than 50 Angstroms, the water vapor transmission rate rises very sharply so that the combination of the aluminum oxide nucleation layer and the silicon dioxide layer is relatively ineffective as a water vapor barrier. Thus it can be seen that the basic parameter which controls the large variation in water vapor transmission rate is the thickness of the aluminum oxide nucleation layer. There is a minor change due to the thickness of the silicon dioxide layer.

In comparing the results in box coaters with roll coaters as shown in Table 1, it can be seen that the results obtained in the roll coater show that the water vapor transmission rate is not quite as low in the roll coater as in the box coater. This is believed to be due to the fact that there are more variables in a roll coater making it more difficult to achieve the same results as in a box coater. However, it can be seen that the results are substantially equivalent and that the great advantage in using the roll coater in producing barrier films at high capacity can make the use of roll coaters for forming such barrier films very desirable because of the cost effectiveness of the roll coaters.

From examining the data which is shown in Table 1, it can be seen that improvements by a factor of 20 can be obtained in the water vapor transmission rate with the use of the nucleation layer and the silicon dioxide layer of the type hereinbefore described. In addition, it can be seen that the water vapor transmission rate is relatively independent of the thickness of the substrate indicating that the barrier qualities are principally provided by the coating on the substrate.

Of the materials utilized for a nucleation layer, the aluminum oxide, the tin oxide and the yttrium oxide, all provide barrier films which are water white transparent.

When tin oxide is utilized as a nucleation layer with silicon dioxide as shown in the graph in FIG. 7, results similar to that shown in FIG. 6 are obtained. Again, it can be seen that when the nucleation layer has a thickness of less than 50 Angstroms, the water vapor transmission rate rises sharply so that it is apparent that whenever the nucleation layer is less than 50 Angstroms in thickness, the water vapor barrier capabilities rapidly diminish. It also can be seen that the thickness of the substrate has very little effect on the water vapor transmission characteristics, although, it is noted that a slightly improved vapor transmission rate is achieved with the thicker substrate.

When yttrium oxide is used as the nucleation layer with silicon dioxide as shown in the graph in FIG. 8 results similar to that obtained in FIGS. 6 and 7 are obtained. These graphs in FIGS. 6, 7 and 8 show that with all four designs with 1 and 2 mil PET, the nucleation layer has an effect at 50 Angstroms and above in thickness.

It has been noted that sometimes when the heat seal coatings are applied, the WVTR's are reduced even further. This effect is attributed to the heat seal coating filling up microscopic pores or pin holes in the oxide coating. This is demonstrated by Table 2 set forth below which gives water vapor transmission rates of barrier films of the present invention.

TABLE 2

WATER VAPOR TRANSMISSION RATES (WVTR)
WVTR of Heat Sealed 1 mil ICI 393/Al₂O₃ 75 Å/SiO₂ 250Å*

| Oxide Barrier | 0.33 ± 0.026 |
| --- | --- |
| Heat Seal/ Oxide Barrier | 0.135 ± 0.034 |

*Heat seal thickness = 0.15 mil

An oxygen permeation test on the 1 mil of roll coated material is set forth below in Table 3:

TABLE 3

OXYGEN TRANSMISSION

| Design Thickness | O₂ TR |
| --- | --- |
| 75Å Al₂O₃ 500Å SiO₂ | 0.15 cc/100 sq.in./day |
| 100Å Y₂O₃ 500Å SiO₂ | 0.0645 cc/100 sq.in/day |
| uncoated substrate | 3–4 cc/100 sq.in/day |

In accordance with the present invention, it has been found that single layers of very thin Al₂O₃ or Y₂O₃ in the range of 75 Å to 175 Å give extremely good barriers toward water vapor as set forth in Table 4 below.

TABLE 4

WATER VAPOR BARRIER DATA
BOX COATER

| Design Thickness | Substrate | WVTR g/100 sq.in./day |
|---|---|---|
| Uncoated | 1 mil PET | 1.2–1.3 |
| Uncoated | 2 mil PET | .56–.63 |
| 100Å $SnO_2$ | 1 mil PET | 1.06 |
| 100Å $SnO_2$ | 2 mil PET | 0.56 |
| 100Å $Y_2O_3$ | 1 mil PET | 0.08 |
| 100Å $Y_2O_3$ | 2 mil PET | 0.086 |
| 100Å $Al_2O_3$ | 1 mil PET | 0.08 |
| 100Å $Al_2O_3$ | 2 mil PET | 0.091 |
| 100Å MS65 | 1 mil PET | 0.0461 |
| 100Å MS65 | 2 mil PET | 0.051 |
| 100Å $SnO_2$/500Å $SiO_2$ | 1 mil PET | 0.073 |
| 100Å $SnO_2$/500Å $SiO_2$ | 2 mil PET | 0.079 |
| 100Å $Y_2O_3$/500Å $SiO_2$ | 1 mil PET | 0.033 |
| 100Å $Y_2O_3$/500Å $SiO_2$ | 2 mil PET | 0.075 |
| 100Å $Al_2O_3$/500Å $SiO_2$ | 1 mil PET | 0.072 |
| 100Å $Al_2O_3$/500Å $SiO_2$ | 2 mil PET | 0.075 |
| 100Å MS65/500Å $SiO_2$ | 1 mil PET | 0.25 |
| 100Å MS65/500Å $SiO_2$ | 2 mil PET | 0.18 |
| 100Å $Al_2O_3$/500Å MS65 | 1 mil PET | 0.0375 |
| 100Å $Al_2O_3$/500Å MS65 | 2 mil PET | 0.05 |

Figure 5:
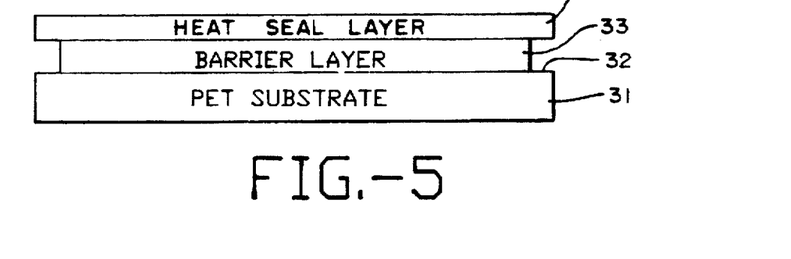
FIG. 5 is a cross sectional view of a barrier film in which the barrier is provided by a single layer.

It also has been found that even MS-65 a mixed oxide alloy produced by Flex Products, Inc., a mixture of 65% $SiO_2$/35% MgO, as described in U.S. Pat. No. 4,702,963, gives exceedingly low WVTR's. This was totally unexpected because published literature has indicated that 1000 Angstroms or greater in thickness of oxide coatings are necessary to achieve low WVTRs. Such a barrier film is shown in FIG. 5 in which a PET substrate 31 having a surface 32 is coated with a layer 33 of either yttrium oxide or aluminum oxide. A conventional heat seal layer 34 is provided. Alternatively, laminated polypropylene or polyethylene can be used for the heat seal layer 34.

It also has been found that low water vapor barrier properties can be achieved on roll coaters at speeds in excess of 100' per minute and still obtain results such as shown in Table 5 below. The roll coated barrier film appears to have a barrier property that is independent of thickness.

TABLE 5

WVTR's on ICI-393, 1 mil PET

| $Al_2O_3$ Thickness | WVTR g/100 sg.in./day |
|---|---|
| 75Å | 0.14 ± 0.03 |
| 100Å | 0.11 ± 0.02 |
| 150Å | 0.10 ± 0.01 |
| 200Å | 0.12 ± 0.03 |

The foregoing establishes that $Al_2O_3$, $SnO_2$ and $Y_2O_3$ can be utilized as a nucleation layer having a thickness ranging from approximately 50 to 100 Angstroms and in combination with silicon dioxide providing a substantial water vapor transmission reduction of approximately 20 fold. The thin nucleation layers above 50 Å and below 175 Å in thickness in combination with the silicon dioxide layer provides unexpected barrier properties. In the case of the $SnO_2$ nucleation layer, one needs to use an $SiO_2$ layer on top of it because the $SnO_2$ by itself does not confer any reduction in water vapor transmission rates (see Table 4). The silicon dioxide overlayer is also beneficial in bonding to the heat seal layer and for providing abrasion resistance to the thin nucleation layer.

Figures 9, 10:
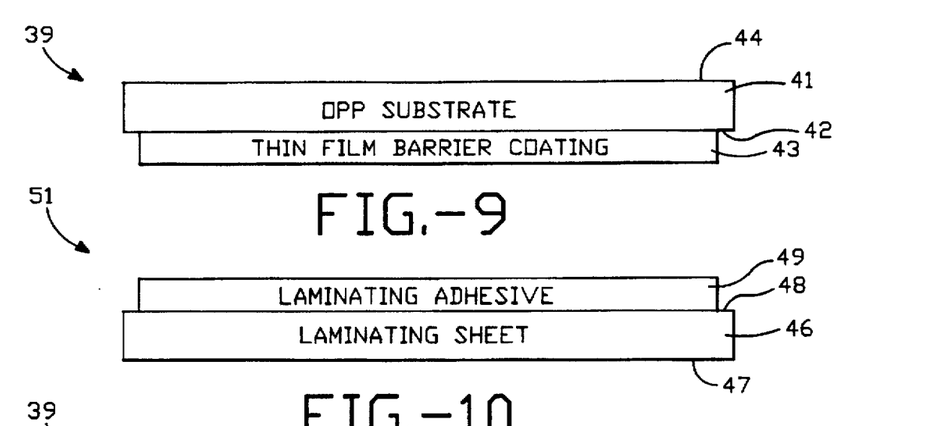
FIGS. 9 and 10 are cross-sectional views showing two pre-lamination constructions incorporating the present invention for a packaging film.

In FIG. 9 there is shown a cross-sectional view of a pre-lamination construction 39 to be used in a packaging film. It consists of a substrate 41 formed of a plastic which is capable of tearing in straight lines. A commercially available homo-polymer oriented polypropylene (OPP) film is utilized and has a thickness ranging from 55 gauge to 80 gauge. In the simplest embodiment, the substrate can be formed of a single layer of the homopolymer polypropylene. This is provided with a non-heat sealable characteristic in which only one surface is treated with a corona to provide an ionic discharge which raises the energy level of the surface of the film and permits organic coatings to wet that surface so that printing or graphics can be provided on that surface of the film.

In order to provide tearing along straight lines desired for this packaging film, the homopolymer polypropylene is bi-axially oriented (OPP) so that it has fairly uniform mechanical characteristics in both machine and transverse directions of the film. Other commercially available polypropylene products include a layer of homopolymer polypropylene which has co-extruded thereon a heat seal polymeric layer of a suitable thickness, such as 0.02 mils. A tri-layer design is also commercially available which has a layer of homopolymer polypropylene with both sides having formed thereon co-extruded layers of a heat seal polymeric layer of a suitable thickness, as for example, 0.02 mils. In either structure described above, one of the exterior surfaces can be provided with a corona surface treatment of the type hereinbefore described. Additional substrate types that are useful for this application include either polymeric films that have been coated with heat sealable layers on one or both surfaces after extrusion.

The substrate 41 shown in FIG. 9 can take the form of any of the various types of polypropylene films hereinbefore described. The barrier layer can be deposited on either side of the polypropylene but the preferred side is the one that has been corona treated. In the embodiments previously described, a nucleation layer has been provided followed by a silicon dioxide layer. In further work, it has been found that most of the barrier properties on PET were provided by the nucleation layer, except in the $SnO_2$ case rather than the $SiO_2$ layer. For that reason, the thickness of the nucleation layer was increased and the use of the silicon dioxide layer was discontinued. The nucleation layer was typically formed of a thickness ranging from 150 to 275 Angstroms depending upon the ultimate barrier properties desired.

Table 6 below shows some WVTR results for roll coated polypropylene with various barrier layers with and without lamination.

TABLE 6

EFFECTS OF LAMINATION[2] ON BARRIER COATED WEBS

| WEB ID | WEB TYPE | BARRIER TYPE | WVTR[1] |
|---|---|---|---|
| 1313–3094 | 80ga. OPP | MS65 | 0.087 |
| TM636-5 | 1313–3094/55ga OPP | MS65 | 0.073 |
| TM636-11 | 1313–3094/1313–3094 | MS65 | 0.026 |
| 1313–3092 | 80ga. PET | $AL_2O_3$ | 0.098 |
| TM636-21 | 1313–3092/92ga. PET | $AL_2O_3$ | 0.058 |
| TM636-27 | 1313–3092/1313–3092 | $AL_2O_3$ | 0.030 |

[1]WVTR IN GM/100 SQ IN/24 HR
[2]LAMINATIONS WERE MADE BY HAND
TM636-5 is a lamination of 1313–3094 and 55 ga. OPP.
TM636-11 is a lamination of 1313–3094 to itself.

TABLE 6-continued

EFFECTS OF LAMINATION[2] ON BARRIER COATED WEBS

| WEB ID | WEB TYPE | BARRIER TYPE | WVTR[1] |
|---|---|---|---|

TM363-21 is a lamination of 1313–3092 to 92 ga. PET
TM363-27 is a lamination of 1313–3092 to itself.

The above Table 6 shows that by laminating the two barrier coated webs into a composite a synergistic affect is realized. A three fold improvement in water vapor transmission was realized where a two fold improvement would ordinarily be expected.

In order to provide heat sealable capabilities for a packaging film, a laminating sheet 46 formed of a polypropylene can be of the type in which there is provided a co-extruded heat sealable surface on one side and a corona treated surface on the other side with the co-extruded side providing a surface 47 and the corona treated side providing a surface 48. The surface 48 is provided with a suitable laminating adhesive 49 to provide a laminating sheet construction 51. The two constructions 39 and 51 are bonded together in the manner shown in FIG. 11 in which the laminating adhesive 49 is brought into contact with a thin barrier coating 43 by the application of heat and pressure so that there is a packaging film 52 which is heat sealable on both sides by use of the surfaces 44 and 47. Typically, the laminating operation is carried out by applying the adhesive as a wet coating and then heating the same, driving out the carrier solvents so that there remains a viscous tacky adhesive. This adhesive is similar to a pressure sensitive adhesive which is adhered to the thin film which, with the application of heat and pressure, causes the laminating adhesive to be activated and to seal to the barrier coating and to bond the two substrates 46 and 41 together so they cannot be peeled apart easily.

Typically, the laminating sheet 46 would have a thickness of ½ mil to ¾ mil whereas the adhesive would have a thickness of approximately 1/10th of a mil. Typically, the substrate 41 can be formed of 70 gauge material whereas the laminating sheet 46 can be formed of 55 gauge material. It is possible to achieve a laminated construction such as that shown in FIG. 11 having a thickness of approximately 1.25 mils.

Figure 12:
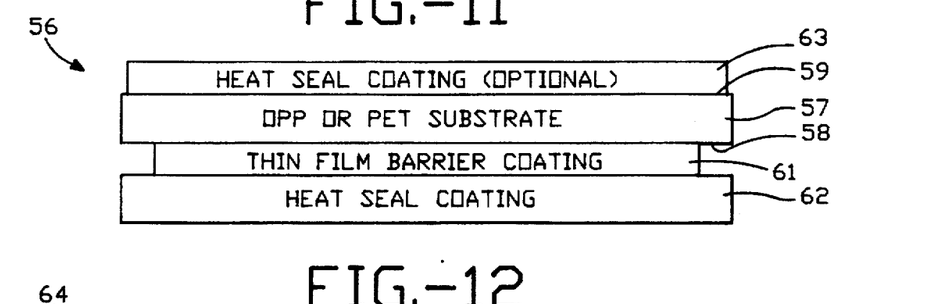
FIG. 12 is a cross-sectional view of a heat seal coated packaging film.

If it is desirable to have a thinner packaging film, an approach such as that shown in FIG. 12 can be utilized because at the present time polymeric substrates of thinner material that are heat sealable are not commercially available. The packaging film construction shown in FIG. 12 is comprised of a homopolymer polypropylene or PET substrate 57 having two surfaces 58 and 59. A barrier coating 61 is applied to the surface 58 in the manner hereinbefore described to a suitable thickness, as for example, 150 Angstroms utilizing aluminum oxide. A heat seal coating 62 is provided on the barrier film 61 to provide a heat seal coating which can be utilized on one side of the packaging film. Depending upon the material utilized for the substrate 57, if needed, a heat seal coating 63 can be provided on the other side 59. Utilizing such a construction it is possible to achieve a packaging film having an overall thickness of less than 0.9 mil with the 70 gauge substrate 57 having a thickness of 0.70 mil and with each of the heat seal coatings 62 and 63 having a thickness of 0.1 mil.

Figure 11:
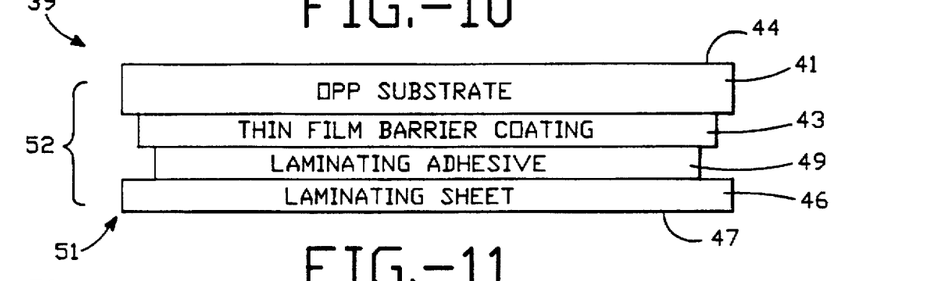
FIG. 11 is a cross-sectional view showing the packaging film post-lamination.

In applications where the packaging film is subjected to heat and tension, it is preferable to utilize the construction shown in FIG. 11 in which the laminating sheet 46 is provided to accommodate the heating and tensioning which may take place. This ensures that the thin film barrier coating will not be deleteriously affected by the heating and tensioning of a heat seal coating. In the construction shown in FIG. 11, the packaging film can be provided without excessive heat or tensioning merely by introducing the two substrates 39 and 51 into a laminating nip after the laminated adhesive has been applied without subjecting the barrier coating 43 to excessive heat during a coating operation when the thin film barrier coating 43 is being applied to the surface 42 of the substrate 41. The only disadvantage is that there is an increased cost for the additional laminating sheet 46 and the additional thickness which may make it necessary to run packaging machinery utilizing the packaging material to run at a lower speed because of the increased heat required for heat sealing because of the thicker packaging material.

Figure 13:
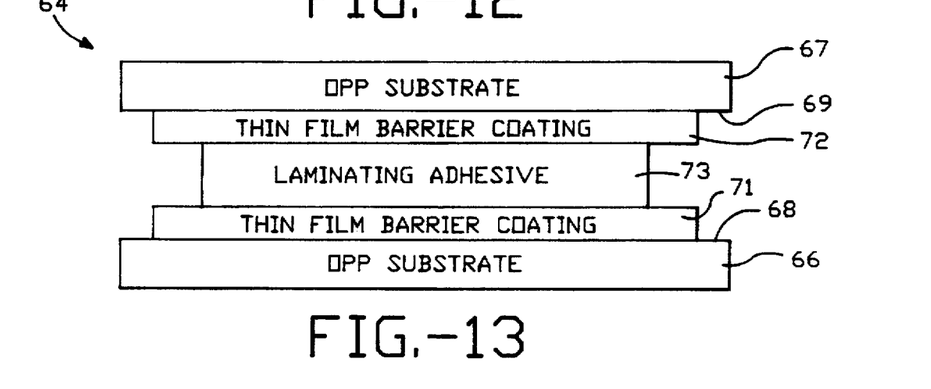
FIG. 13 is a cross-sectional view of a barrier-type film construction which is heat sealable onto itself and on which the two layers of a barrier coating are provided facing each other.

In FIG. 13 there is shown another construction of a barrier-type packaging film 64 which is comprised of biaxially oriented coextruded polypropylene substrates 66 and 67 having surfaces 68 and 69 respectively upon which there is provided barrier coating 71 and 72 of a suitable thickness ranging from 50 to 180 Angstroms formed of a suitable material such as aluminum oxide. The two substrates 66 and 67 are laminated together by applying a laminating adhesive 73 between the facing barrier films 71 and 72 so that the barrier films are face to face in the center of the laminated construction. Such a barrier type packaging film has at least two advantages. By placing the two barrier coatings 71 and 72 facing each other any cracks or holes appearing in one of the barrier coatings would be covered by the other barrier coating to thus, in effect, provide double protection. By providing the biaxially coextruded polypropylene substrates 66 and 67 on opposite sides, the barrier-type packaging film 66 can be heat sealed onto itself.

Figure 14:
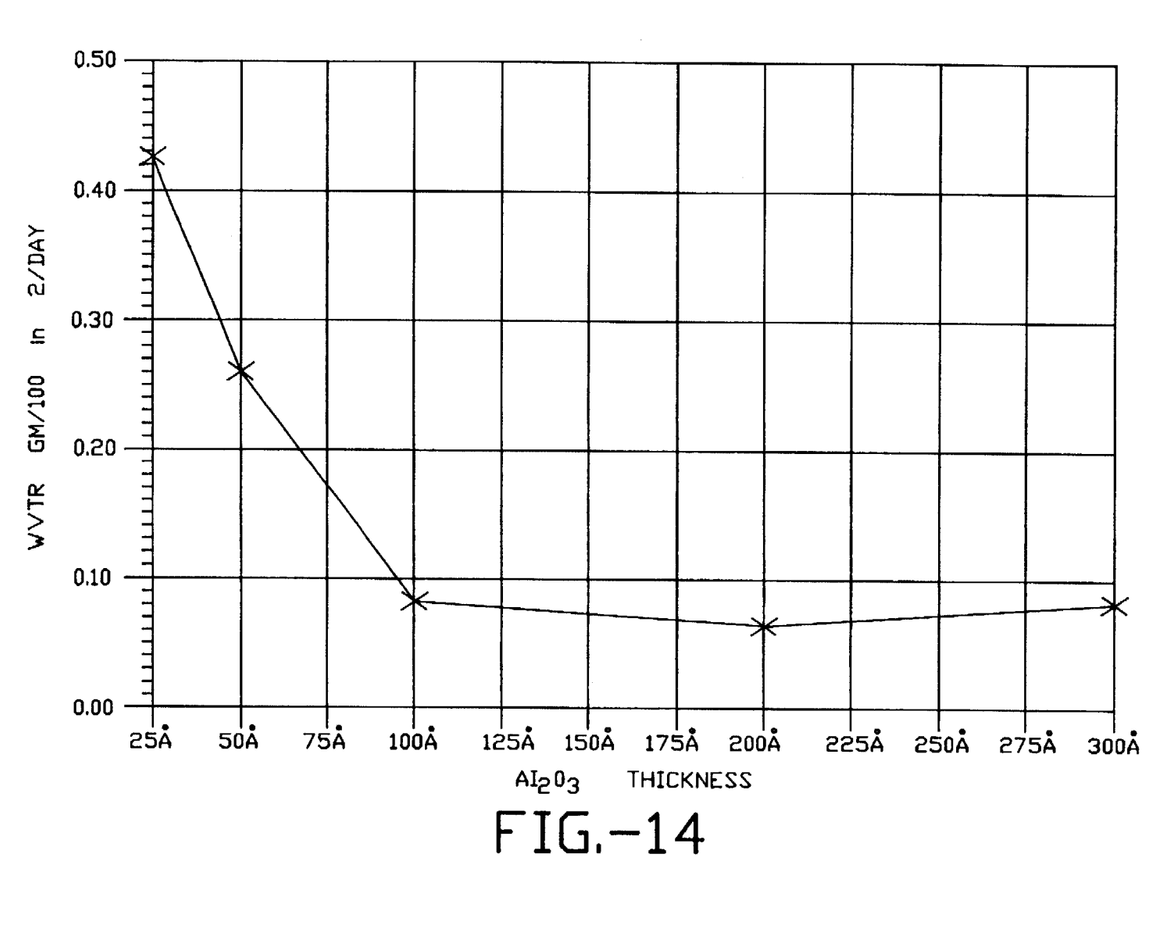
FIG. 14 is a graph showing water vapor transmission rates for single layer aluminum oxide ($AL_2O_3$) on 70 gauge polypropylene.

In FIG. 14, a graph is shown in which the water vapor transmission data for a single layer of aluminum oxide on 70 gauge polypropylene ranging in thickness from 25 to 300 Angstroms. The graph shows that the water vapor transmission decreases substantially from 25 Angstroms to 100 Angstroms and then it approximately the same for greater thicknesses of aluminum oxide.

In comparing the graph shown in FIG. 14 with the graph shown in FIGS. 6, 7 and 8, it can be seen that a greater thickness of aluminum oxide is required to achieve the same water vapor transmission rates. The polypropylene requires a greater thickness of barrier coating than does the polyester.

From the foregoing, it can be seen that when a barrier coated substrate is laminated to a heat sealable substrate and when a heat seal coating is applied directly to a barrier film, a packaging film is created which can be used as an overwrap to retard the moisture vapor and gas migration to or from foods, pharmaceutical devices, tobacco products and other industrial products.

As hereinbefore disclosed for polyester based barrier films, a heat seal coating is required to provide a sealing surface. Heat seal coatings may be applied to either/or both sides of the barrier coated film depending on the particular finished product seal or laminating requirements. For lap-type seals, the heat seal coating would normally be applied to both sides of the barrier coated film. For fin-type sealing or lamination, the heat seal coating would normally be applied to the barrier coated side only. For certain special applications, the heat seal coating can be applied to the non-barrier coated side of the film.

For polypropylene films, a heat seal coating may or may not be required for both surfaces of the film depending upon the polypropylene chosen and on the particular application.

For the heat seal layers, conventional heat seal coating resin systems can be utilized which can include polyester urethane, ethylene interpolymers (EVA, EAA type polymers) and acrylic based formulas. Both water reduced and solvent reduced coatings can be used depending upon the type of substrate chosen and the surface treatment of the substrate. In general it has been found that water based heat seal coatings require a corona treated surface to obtain good adhesion of the coating to the substrate. These heat seal coatings can be modified with slip agents to improve their machineability.

From the foregoing it can be seen that there has been provided a barrier film which is highly transparent in the visible region which serves as a barrier to water vapor and oxygen. Polymeric film substrates can be used. The use of the vacuum deposited inorganic oxide such as the silicon dioxide makes it possible to replace existing aluminized polyester and co-extruded polymeric films. Because of the capabilities of utilizing thinner substrates, the total volume of plastic utilized is greatly reduced. The use of the silicon dioxide or aluminum oxide coating will also reduce the difficulty in recycling plastic because in recycling processes, the thin oxide film will simply act as a trace component and can be worked into the new polymer as a filler.

It should be appreciated that the nucleation layer and barrier layer combinations can be deposited by other methods of vacuum deposition including C.V.D. plasma-type sputtering processes, ion assisted processed such as ion plating, as for example, meta-mode (™), as well as others well known to those skilled in the art of vacuum deposition.

What is claimed is:

1. A barrier film consisting of a flexible transparent substrate having a thickness ranging from approximately ½ mil to 4 mils and having a surface and a thin film vacuum-deposited barrier coating formed on said surface, said barrier coating being formed as a single layer of a single material having a thickness ranging from approximately 50 to less than 200 Å and being formed of a dielectric material selected from the group consisting of aluminum oxide, yttrium oxide and a mixed oxide alloy consisting of 65% $SiO_2$ and 35% MgO, said barrier coating in combination with said flexible transparent substrate forming a film having a water white high colorless transparency and being impermeable to water and oxygen.

2. A barrier film as in claim 1 wherein said barrier coating is formed of aluminum oxide.

3. A barrier film as in claim 1 wherein said aluminum oxide has a purity of 99% or better.

4. A barrier film as in claim 1 wherein said substrate is formed essentially of polypropylene.

5. A barrier film as in claim 4 together with an additional substrate formed of a polypropylene having a barrier coating deposited on the surface, a laminating adhesive adhering the barrier coating of the first named substrate to the barrier coating of the additional substrate.

6. A barrier film as in claim 1 wherein the substrate is provided with an additional surface together with a heat seal layer disposed on the additional surface.

7. A barrier film as in claim 1 together with a laminated heat seal layer disposed on the barrier coating.

8. A barrier film consisting of a flexible transparent substrate having a thickness ranging from approximately ½ mil to 4 mils and having a surface and a thin film vacuum-deposited barrier coating formed on said surface, said barrier coating being formed as a single layer of a single material having a thickness ranging from approximately 50 to less than 200 Angstroms and being formed of a material selected from the group consisting of aluminum oxide, yttrium oxide and a mixed oxide alloy consisting of 65% $SiO_2$ and 35% MgO, said barrier coating in combination with said flexible transparent substrate forming a film having a water white high colorless transparency and being impermeable to water and oxygen, said substrate being provided with an additional surface opposite the first named surface and a barrier coating formed on the additional surface, said barrier coating on said additional surface being formed as a single layer of a single material having a thickness ranging from approximately 50 to less than 200 Angstroms and being formed of a material selected from the group consisting of aluminum oxide, yttrium oxide and a mixed alloy consisting of 65% $SiO_2$ and 35% MgO.

9. A barrier film as in claim 8 together with a heat seal layer formed on at least one of said barrier coatings.

10. A barrier film as in claim 9 together with a heat seal layer formed on each of the barrier coatings.

11. A barrier film consisting of a flexible plastic substrate having a thickness ranging from approximately ½ mil to 4 mils and having a surface and a thin film vacuum-deposited barrier coating formed on said surface, said barrier coating being formed of a combination of at least two layers of at least two different materials having an overall thickness ranging from 300 to 600 Å with one of said at least two layers being a nucleation layer formed of a material selected from the group consisting of aluminum oxide, tin oxide, yttrium oxide and a mixed oxide alloy consisting of 65% $SiO_2$ and 35% MgO, the other of said at least two layers being formed of a material selected from silicon dioxide and a mixed oxide alloy consisting of 65% $SiO_2$ and 35% MgO, said barrier coating in combination with said flexible plastic substrate forming a barrier film having a water white high colorless transparency in the visible region and being impermeable to water and oxygen.

12. A barrier film as in claim 11 wherein said nucleation layer is formed of aluminum oxide.

13. A barrier film as in claim 11 wherein the nucleation layer is formed of a material having a purity of 99% or better.

14. A barrier film as in claim 11 wherein said plastic substrate is formed essentially of a polyester.

15. A barrier film as in claim 11 wherein said substrate is formed essentially of a polypropylene.

16. A barrier film as in claim 15 wherein the substrate is provided with an additional surface together with a propylene heat seal layer disposed on the additional surface.

17. A barrier film as in claim 11 together with a heat seal layer disposed on the barrier coating.

18. A barrier film as in claim 11 wherein the substrate is provided with an additional surface opposite the first named surface and a vacuum deposited barrier coating formed on said additional surface and being formed of a combination of at least two layers of at least two different materials having an overall thickness ranging from 300 to 600 Angstroms with one of said at least two layers being a nucleation layer formed of a material selected from the group consisting of aluminum oxide, tin oxide, yttrium oxide and a mixed oxide alloy consisting of 65% $SiO_2$ and 35% MgO, the other of said at least two layers being formed of a material selected from silicon dioxide and a mixed oxide alloy consisting of 65% $SiO_2$ and 35% MgO.

19. A barrier film as in claim 18 together with a heat seal layer carried by the substrate on one of said first named and additional surfaces.

20. A barrier film as in claim 18 wherein the nucleation layer of the at least two layers on the additional surface has a thickness ranging from 50 to 180 Angstroms and wherein the other layer of the at least two layers of silicon dioxide on the additional surface has a thickness ranging from 100 to 500 Angstroms.

21. A barrier film as in claim 11 together with a laminating sheet formed essentially of polypropylene and a laminating adhesive adhering the laminating sheet to the thin film barrier coating.

22. A barrier film as in claim 11 together with a heat seal coating deposited on the thin film barrier coating.

23. A barrier film as in claim 22 together with a heat seal coating on the substrate on the opposite side on which the thin film barrier coating is provided.

24. A barrier film as in claim 22 together with an additional substrate formed essentially of polypropylene having a barrier coating deposited on the surface and a laminating adhesive adhering the thin film barrier coating of the first named substrate to the barrier coating of the additional substrate surface.

* * * * *